United States Patent [19]
Grimmett et al.

[11] Patent Number: 5,150,082
[45] Date of Patent: Sep. 22, 1992

[54] CENTER FREQUENCY CALIBRATION FOR DC COUPLED FREQUENCY MODULATION IN A PHASE-LOCKED LOOP

[75] Inventors: Scott B. Grimmett, Veradale; David P. Whipple, Greenacres; Marcus K. DaSilva, Spokane, all of Wash.

[73] Assignee: Hewlett-Packard Company, Palo Alto, Calif.

[21] Appl. No.: 839,826

[22] Filed: Feb. 21, 1992

[51] Int. Cl.$^5$ .................... H03L 7/081; H03L 7/16; H03C 3/00
[52] U.S. Cl. ................................ 332/128; 331/23; 455/113
[58] Field of Search .............. 332/100, 101, 127, 128; 331/10, 16, 17, 23; 455/113

[56] References Cited
U.S. PATENT DOCUMENTS 4,546,331 10/1985 DaSilva et al. ............... 332/128
5,038,120 8/1991 Wheatley et al. .............. 332/128

Primary Examiner—David Mis

[57] ABSTRACT

A method of providing DC coupled frequency modulation without center frequency offset of a RF carrier frequency generated in a phase-locked loop circuit. The circuit is automatically calibrated to generate a feedback signal for cancelling DC offsets at the input of the coupling integrator with a digital-to-analog converter and resistor network driven by a digital counter. After removing frequency modulation, the coupling integrator's output will ramp while the offsets remain uncancelled. Incrementing or decrementing the digital counter in response to the integrator's output will adjust the feedback signal until the offsets are cancelled and the integrator ceases to ramp. The counter value is stored in a memory to allow subsequent presetting of the feedback signal to the calibrated magnitude. Holding the feedback signal constant thereafter during DC coupled frequency modulation keeps the RF carrier at center frequency.

16 Claims, 3 Drawing Sheets

CENTER FREQUENCY CALIBRATION FOR DC COUPLED FREQUENCY MODULATION IN A PHASE-LOCKED LOOP

FIELD OF THE INVENTION

The invention relates generally to frequency modulation of a synthesized carrier generated in a phase-locked loop, and more particularly relates to cancellation of DC offsets in order to calibrate the center frequency of a frequency modulated carrier generated by a phase-locked loop.

BACKGROUND AND SUMMARY OF THE INVENTION

A well known means for synthesizing signals of desired frequencies is the phase-locked loop circuit. Phase-locked loop (PLL) circuits comprise a tunable oscillator and a phase comparator. Typically, a voltage-controlled oscillator (VCO) is used as the tunable oscillator. The output of the VCO is the synthesized signal which is locked to a known reference frequency signal by means of the phase comparator. The phase comparator generates an output signal that is proportional to the phase difference between the synthesized signal and the reference signal. The phase comparator output is fed back to the input of the VCO and used to tune the VCO. The output of the VCO is thereby forced to have exactly the same frequency as the reference signal. Typically, a PLL will also include a loop filter interposed between the phase comparator output and the VCO input through which the phase comparator output signal is fed back to the VCO.

The synthesized signal may also be controlled to have a frequency which is a multiple of the reference signal's frequency by interposing a divide-by-N block between the VCO output and the phase comparator. The output of the VCO will then be locked to a frequency which is N times that of the reference signal. As will be recognized by those skilled in the art of frequency synthesizers, the principles of the present invention apply equally to numerous other PLL circuit topologies that vary from this basic configuration in one or more implementation details.

In many applications, it is desirable to frequency modulate the synthesized signal. However, since the PLL acts to control the frequency of the synthesized signal to maintain a constant phase difference between the synthesized signal and a reference signal, it is difficult to frequency modulate the synthesized signal. Any variation in phase between the synthesized signal and the reference signal, including frequency modulation, tends to be removed by the PLL frequency control.

Several methods of frequency modulating a PLL synthesized signal have been proposed. One such method is disclosed by M. DaSilva, D. Whipple, and R. Temple in U.S. Pat. 4,546,331, issued on Oct. 8, 1985 and entitled "Frequency Modulation in a Phase-Locked Loop." The patent describes a method of accomplishing frequency modulation (FM) of a PLL synthesized signal by splitting the FM signal into two separate signal paths for coupling to the PLL. In the first path, the FM signal is AC coupled to the VCO by interposing a summation node between the phase detector and VCO and connecting the FM signal thereto. This is the primary path for the FM signal for modulation frequencies that are above the bandwidth of the PLL. Frequency modulation of modulation frequencies inside the PLL bandwidth takes the second path.

In the second path, the FM signal is DC coupled to the PLL. The FM signal is integrated and then injected into a summing node at the output of the phase detector. Typically, the integration is accomplished with an analog integrator consisting of an OP-AMP and a capacitor. Since phase is the integral of frequency, frequency modulation within the PLL bandwidth is accomplished by phase modulation. By properly scaling the gain of each signal path, a flat FM response may be provided for modulation frequencies both inside and outside the PLL bandwidth.

Without more, however, this basic circuit would be limited by the phase detector range, integrator range and loop bandwidth which restrict the PLL's modulation index $\beta$ or amount of phase deviation from the center frequency of the PLL. The modulation index is given by the following equation which relates phase deviation to the amount of frequency deviation.

$$\beta = \frac{f_{pk}}{f_m} = \theta_{pk} \qquad (1)$$

U.S. Pat. No. 4,546,331 describes additional circuitry useful for overcoming these limitations to extend the frequency response of the PLL down to zero Hertz. The additional circuitry operates to add or remove one or more cycles of the VCO output from the divide-by-N block input, precisely reset the integrator, and precisely measure the instantaneous phase deviation.

More specifically, whenever the output voltage of the integrator exceeds, positively or negatively, preset threshold voltage levels, a three-modulus prescaler removes or adds one or more cycles at the input to the loop divide-by-N block, effectively removing or adding an integral multiple of two pi radians of phase change to the input of the divide-by-N block. The cycle addition and removal may alternately by implemented by use of separate cycle 'swallower' and cycle "burper" circuits interconnected between the VCO output and the divide-by-N block which add or remove a cycle of the VCO output signal before it is applied to the divide-by-N block. A second alternative implementation would be to replace the divide-by-N block with a programmable divider which effects addition of a cycle by momentarily changing the divider's 0 modulus from N to N−1 and removal of a cycle by momentarily changing the modulus from N to N+1.

Concurrently with the cycle addition or removal, the integrator is reset by adding to or removing from the integrator input a precise amount of charge which exactly cancels the amount of phase which has been removed or added at the input to the divide-by-N block. When the integrator is implemented as a combination of an OP-AMP and a capacitor, this is typically accomplished by selectively injecting precise amounts of charge at the input of the OP-AMP.

A remaining limitation to this approach is its frequency accuracy, which is limited by offset voltages and leakage currents in the FM signal path. Any offset at the integrator input translates into a center frequency shift of the output signal of the VCO. To prevent center frequency drift, DC feedback around the integrator is provided through a resistor network. This effectively moves the pole of the frequency response away from zero hertz. Additionally, an up/down counter and digital-to-analog converter (DAC) are utilized to feed back a signal to the integrator input through the resistor network which is proportional to the number of pulses added or removed at the divide-by-N block. The DAC and counter are needed to reconstruct a signal proportional to the phase gained or lost by adding or removing a cycle at the divide-by-N block or in other words, proportional to the exact instantaneous phase deviation of the PLL. This feedback signal is appropriately scaled by the resistor network. The resulting circuit provides AC coupled frequency modulation (ACFM) of the synthesized signal with no center frequency offset.

The foregoing circuitry may also be operated for DC coupled frequency modulation (DCFM) of the PLL synthesized signal by switching off the DC feedback around the integrator and disabling the instantaneous phase deviation feedback signal generated by the DAC and counter. With no feedback, the integrator does not cancel the DC offsets. The loop output frequency will then respond to DC voltages in the FM signal path to provide DCFM of the PLL signal. Unfortunately, with no feedback, any offset in the FM signal path translates into an offset of the center frequency.

One way to correct for offsets in the FM signal path is to add an offset compensation signal to the FM signal path to cancel the offsets present in the path. This method suffers the disadvantage that once the offset compensation signal is set, any changes in the offsets due to temperature drift or other cause will again result in a move of the PLL output frequency away from center.

In accordance with the present invention, a modification to the circuitry in the prior art frequency modulated PLL circuit described above allows the circuit to perform a self-calibration to remove the center frequency offset without manually measuring the frequency or adjusting the offset compensation current. The circuitry of the present invention is thereby capable of DCFM operation without center frequency offset. The circuitry is modified by addition of a feedback register and a memory device. The feedback register is connected between the up/down counter and the DAC. The memory device is connected to the feedback register in order to store a value from the feedback register and to load the feedback register with a stored value. The present invention may be alternately embodied in any configuration of the memory device with the circuit that allows storage of a value from the up/down counter and pre-setting of the DAC feedback signal to a level proportional to the stored value.

The calibration starts by removing any modulation signals present on the FM signal path. Only DC offsets should remain. The counter and DAC are enabled to allow DC feedback around the integrator. With the modulation signals removed, the DAC feedback signal will settle to a level at which a feedback signal equal and opposite to the offsets is generated at the integrator input. After the DAC settles, this feedback signal cancels the offsets and their effect on the PLL output frequency. At this point, the value at the DAC input is held constant so that the DAC feedback signal remains constant. The circuit is then calibrated and ready for DCFM operation. DCFM operation without center frequency drift is possible since the fixed DAC feedback signal remains to cancel the offsets. If the offsets subsequently change, self-calibration should be reinitiated to move the PLL frequency back to center.

The memory device is used to eliminate unnecessary recalibration. Since the AC corner of the integrator is set very low to meet FM requirements, settling time of the DAC feedback signal can be relatively long. It is therefore desirable to avoid unnecessary calibration by performing the calibration process only as a result of a change in the offsets. Accordingly, after a calibration is completed, the value of the fixed DAC input is stored in the memory device. The DAC input can thereafter be preset to the calibrated value at any time. This feature allows DCFM operation to be discontinued and then later resumed without additional repetition of the calibration process and loss of time.

The foregoing and additional features and advantages of the invention will be more readily apparent from the following detailed description, which proceeds with reference to the accompanying drawings.

The foregoing features and advantages of the present invention will be more readily apparent from the following detailed description, which proceeds with reference to the accompanying drawings.

DETAILED DESCRIPTION

Figure 1:
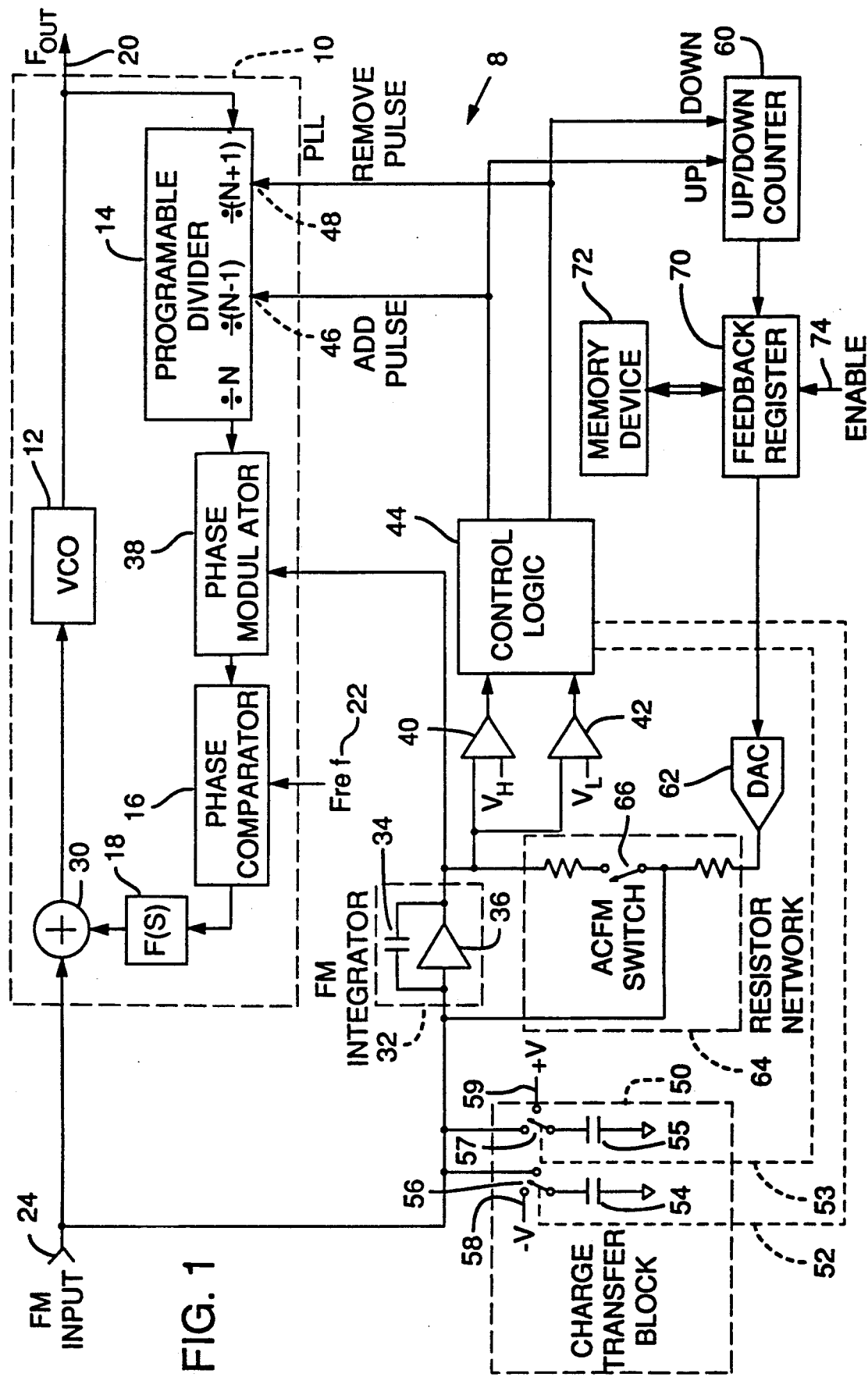
FIG. 1 is a schematic diagram of a frequency modulated phase-locked loop in accordance with a preferred embodiment of the present invention.

With reference to FIG. 1, a frequency modulated phase-locked loop circuit 8 includes a phase-locked loop (PLL) 10 comprising a voltage controlled oscillator (VCO) 12, a programmable divider 14, a phase comparator 16, and a loop filter 18. The programmable divider 14, phase comparator 16, and loop filter 18 form a feedback path from output to input of the VCO 12. This circuit combination acts to produce, at the output of VCO 12, a synthesized signal 20 controlled by feedback through phase comparator 16 to have a frequency which is N times a reference frequency signal 22. Phase-locked loops such as the PLL 10 just described are a well-known means for synthesizing a signal having a constant frequency proportional to the frequency of a reference signal. Various other configurations of a PLL, differing from PLL 10 in one or more details, are also well-known. For example, it is not necessary to implement a PLL with a voltage controlled oscillator. A current controlled oscillator could instead be used. Likewise, the present invention does not depend on its implementation with the PLL 10 having the preferred configuration described above. Numerous other PLL configurations having at least a variable frequency oscillator and a phase comparator are suitable for implementation of the present invention in an alternative embodiment. In addition to PLL 10, the frequency-modulated PLL circuit 8 includes FM circuitry for AC and DC coupling of frequency modulation (FM) signals presented at a FM input 24 to the PLL 10.

Figure 3:
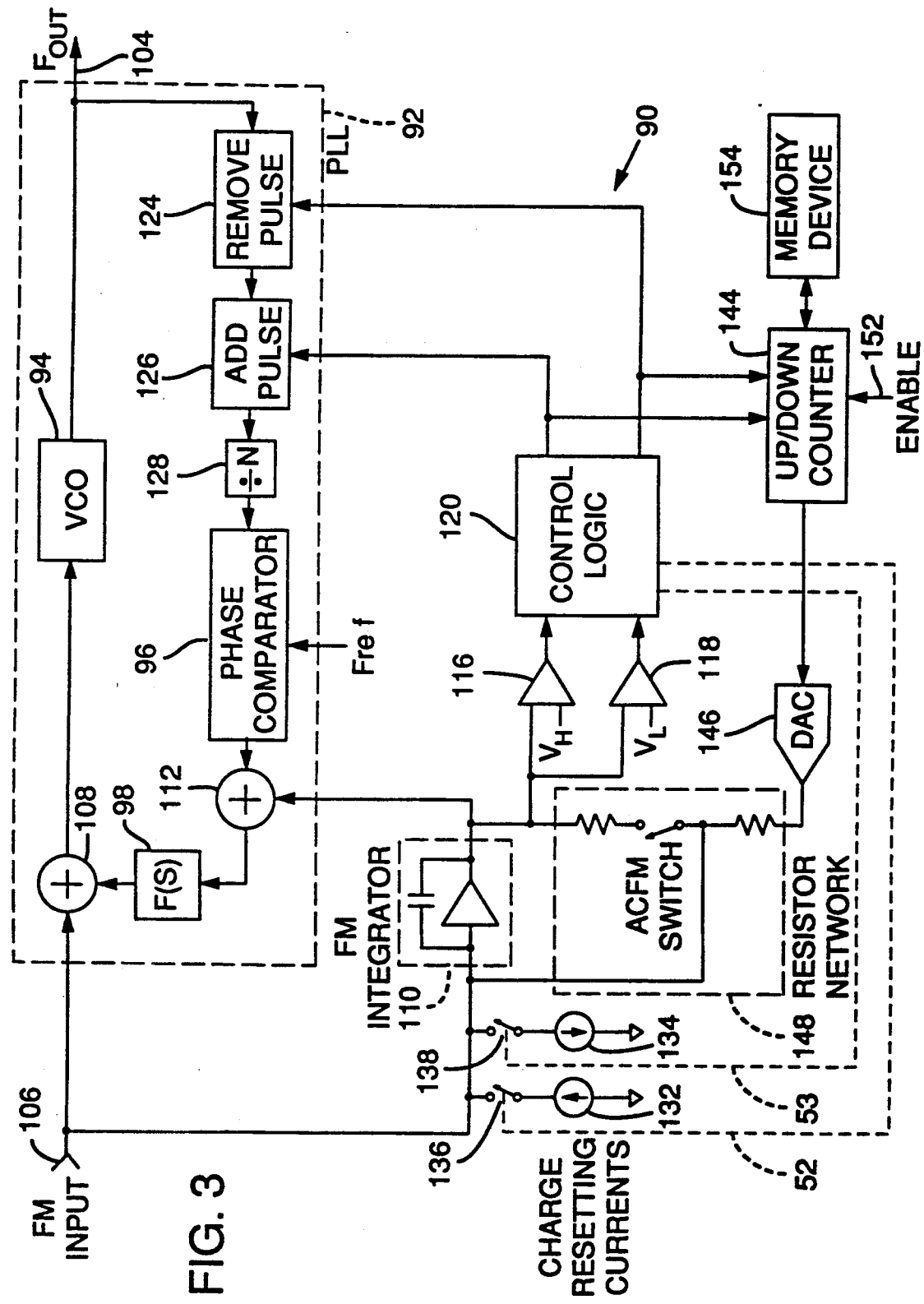
FIG. 3 is a schematic diagram of a frequency modulated phase-locked loop in accordance with a second embodiment of the present invention.

For AC coupling FM signals to PLL 10, a summing node 30 is connected between loop filter 18, VCO 12, and FM input 24. This is the primary path for modulation signals having a frequency above the bandwidth of PLL 10. DC coupling of FM signals to PLL 10 is accomplished through an integrator 32 consisting of a capacitor 34 and an OP-AMP 36. The DC coupled FM signals are preferably summed into the PLL through a phase modulator 38 connected between the programmable counter 14 and phase comparator 16 after integrating. As shown in FIG. 3 and described below, the integrator output may alternately be coupled to a summing node which is connected between phase comparator 16 and loop filter 18, thereby summing the FM signals into the PLL. This second path provides coupling of FM signals having a frequency within the PLL bandwidth.

Referring to FIG. 1, in order to increase the modulation index available in the PLL 10, the circuit 8 also comprises circuitry for inserting or removing cycles of the synthesized signal 20 from the feedback path of PLL 10, while also precisely resetting integrator 32. A comparator 40 outputs a high threshold pulse signal whenever the output of integrator 32 exceeds an arbitrary high threshold voltage level. A second comparator 42 outputs a low threshold pulse signal whenever the integrator's output crosses an arbitrary low threshold voltage level. The pulses are fed through a control logic 44 to an add pulse input 46 and a remove pulse input 48 of the programmable divider 14.

When a high threshold pulse signal is received by the programmable divider 14 at the add pulse input 46, the modulus of the programmable divider is momentarily changed from N to N−1, which effectively inserts a cycle into the PLL feedback path. Similarly, the low-threshold pulse signal, when received at the remove pulse input, will change the divider's modulus from N to N+1 to effectively remove a cycle of the synthesized signal from the PLL feedback path. While insertion and removal of cycles from the feedback path is preferably accomplished with a programmable divider, alternate means of cycle insertion and removal suitable to the present invention exist. In the alternate embodiment illustrated in FIG. 3, for instance, cycle insertion and removal is accomplished by separate pulse remove and pulse add blocks connected between the VCO output and a divide-by-N counter. Insertion and removal can also be equivalently implemented with a separate three-modulus pre-scaler and divide-by-N counter in place of the single programmable divider 14.

Referring again to FIG. 1, in response to the high and low threshold pulses, control logic 44 also sends control signals to a charge transfer block 50 on lines 52 and 53 to selectively inject a precise amount of charge into the integrator 32, thus offsetting the phase change caused by adding or removing a cycle at programmable divider 14. The integrator 32 is thereby reset. The charge transfer block 50 includes two capacitors 54 and 55 and two switches 56 and 57. The capacitors 54, 55 each have a first terminal connected to ground and a second terminal connected to switches 56, 57 respectively. Switch 56, in the absence of a control signal on line 52 from the control logic 44, serves to connect the capacitor 54 to a first reference voltage terminal 58 to thereby charge the capacitor to a voltage level, $-V_{ref}$. In response to a control signal from control logic 44 on line 52, the switch 56 connects the capacitor to the integrator 32 input instead, thereby injecting the proper amount of charge into the integrator to compensate for the addition of a cycle by divider 14. Likewise, switch 57 normally serves to connect capacitor 55 to a second voltage terminal 59 and charge capacitor 55 to a voltage, $+V_{ref}$. However, in response to a control signal on line 53, switch 57 operates to instead connect capacitor 55 to the integrator input to inject the precise amount of charge to compensate for the removal of a cycle. Injection of charge into the integrator 32 is preferably performed by circuitry such as charge transfer block 50 having two capacitors and two switches. However, injection of charge may also be suitably performed by a pair of current sources such as those illustrated in FIG. 3 and described below.

To obtain AC coupled frequency modulation (ACFM), DC feedback around the integrator 32 is required to move the pole away from zero hertz. A resistor network 64 feeds current from the integrator output back to the integrator input. Also, an up/down counter 60 and a digital-to-analog converter (DAC) 62 feedback a signal through the resistor network 64 to the integrator 32 input. The DAC feedback signal is proportional to the total number of pulses added or removed at the divide-by-N counter 14. The sum of the DAC signal and the feedback current from the integrator output is consequently proportional to the exact instantaneous phase deviation. The feedback signal is generated as follows: A count value in up/down counter 60 is incremented by control logic 44 in response to each low threshold pulse signal. The count value is decremented in response to each high threshold pulse signal. The DAC 62 produces a voltage proportional to the count value. The voltage is scaled by the resistor network 64 to a feedback signal of proportionate current magnitude and presented at the integrator 32 input. With this feedback circuitry, ACFM with no drift of the PLL center frequency is obtained.

DC coupled frequency modulation (DCFM) is obtained by disabling instantaneous phase deviation feedback around the integrator 32. A switch 66 in the resistor network 64 disconnects direct DC feedback through the resistor network. The feedback signal generated by the DAC 62 is also disabled. The frequency of the synthesized signal 20 is then able to respond to DC voltages in the FM signal which may unfortunately include offsets that cause center frequency drift.

The circuit 8 also includes circuitry for providing a DCFM calibration mode which allows the FM circuitry to remove center frequency offsets in DCFM operation. In a preferred embodiment, DCFM calibration is provided by a feedback register 70 and a memory device 72. The feedback register 70 is connected between the up/down counter 60 and the DAC 62. The memory device 72 is connected to the feedback register. The feedback register 70 operates in response to an enable signal at the enable input 74 of the feedback register to load digital values from either the up/down counter 60 or the memory device 72. When a disable signal is received at enable input 74, however, the value held in the feedback register is fixed and does not change with a change in the value in the up/down counter 60 or memory device 72. During ACFM operation of circuit 8, an enable signal is applied to the input 74 causing the feedback register 70 to load values from the up/down counter 60, thus allowing generation of the instantaneous phase deviation feedback signal by the DAC 62 and resistor network 64. Operation of the feedback register 70 during DCFM operation and the calibration mode is described below. DCFM calibration circuitry may also be provided by connecting a memory device to the up/down counter as shown in FIG. 3.

Figure 2:
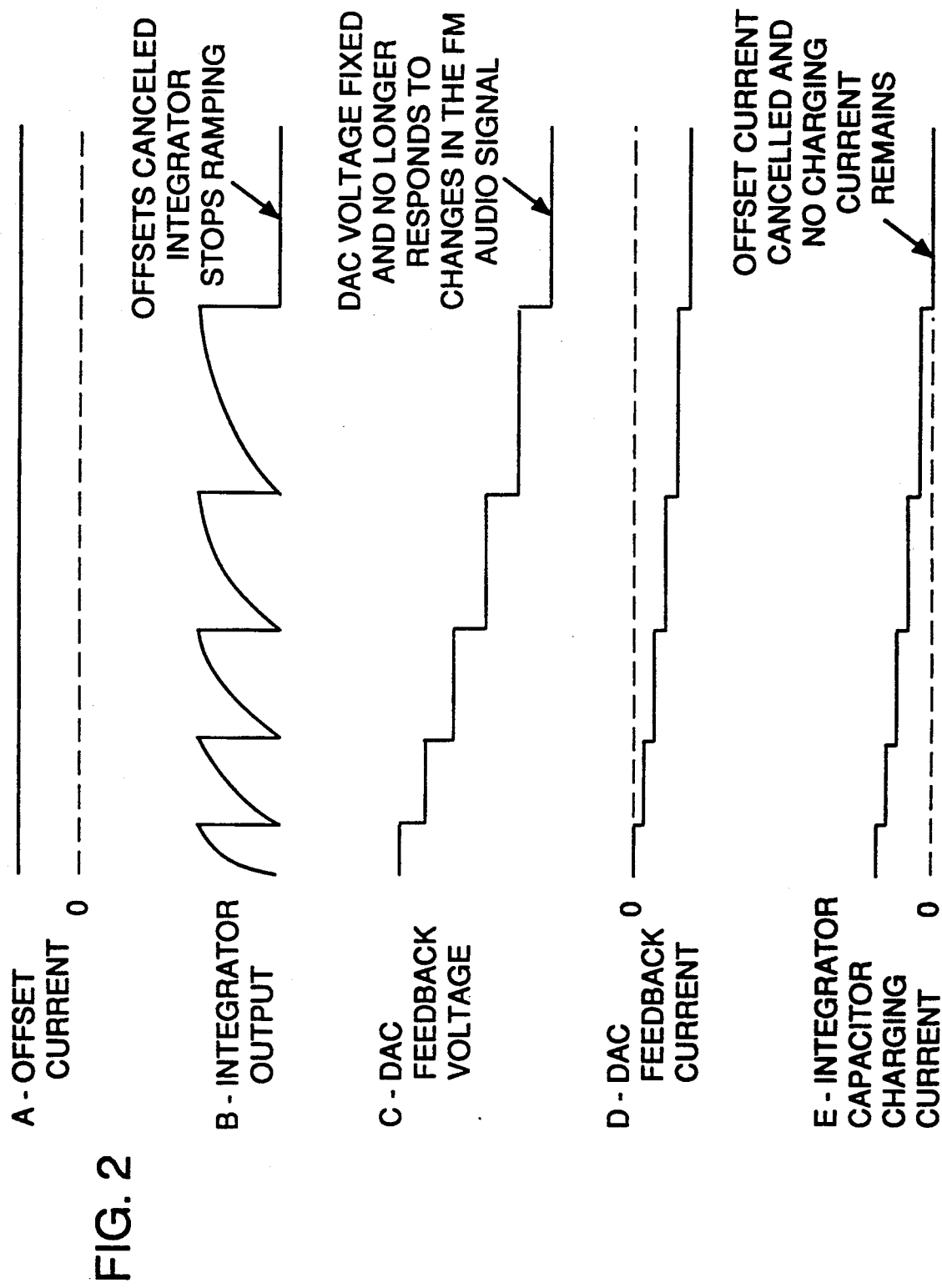
FIG. 2 is a waveform diagram illustrating the signals in the electronic circuit of FIG. 1 during a calibration process.

The calibration is performed by first removing any modulation signals present in the FM signal, leaving only DC offsets at the FM input 24. With reference to FIG. 2, the DC offsets can be represented as a constant current having a waveform shown as waveform A. The DC offsets are essentially constant since changes to the DC offsets are generally due to temperature drift occurring over an extended time period. Since the FM input 24 is connected to the integrator 32, the offset current is presented to the input of the integrator. Therefore, at the start of the calibration, the integrator's capacitor charging current shown as waveform E is essentially equal to the offset current, waveform A.

The next step is to enable the feedback register 60 allowing DC feedback around the integrator 32. The ACFM switch 66, which is normally in closed position during operation of the up/down counter 60 and DAC 62 for ACFM operation, need not be closed for calibration. With the DAC feedback path enabled, the DAC will settle to a voltage that produces a current to cancel the offset current. The settling occurs more specifically as follows.

With a non-zero capacitor charging current, waveform E, the output of the integrator 32 ramps as shown in waveform B. When the integrator output reaches the high threshold level, comparator 40 generates a pulse that decrements up/down counter 60. Since the feedback register 70 is enabled, the feedback register will be continuously updated to the current value of the up/down counter and will therefore immediately load the new decremented value of the up/down counter. The DAC feedback voltage, shown as waveform C, is proportional to the value in the feedback register. Therefore, the DAC feedback voltage decreases as well.

The DAC feedback voltage is converted into a feedback current, shown as waveform D, to the integrator 32 input by the resistor network 64. The capacitor charging current is a function of the currents at the integrator input. Thus, since the DAC feedback current increased negatively and the offset current remains constant, the capacitor charging current, waveform E, decreases. With a decreased capacitor charging current the integrator 32 output, waveform B, ramps more slowly. At the same time that the feedback current was generated, the integrator was reset by the control logic 44 and charge transfer block 50. Therefore, the cycle will repeat, with the capacitor charging current decreasing each cycle, until the DAC feedback current is equal and opposite to the offset current. When this occurs, the capacitor charging current, waveform E, is zero and the integrator 32 ceases to ramp. At this point, the offset current is cancelled by the feedback current. How closely the offset current can be matched by the feedback current, however, is limited by the DAC resolution. The DAC feedback signal will settle in a similar manner for DC offsets that are negative rather than positive.

Once the feedback current has settled to the correct value, the next step is to hold the feedback current constant by fixing the value provided to the input of DAC 62. This is accomplished by disabling the feedback register 70 so that any further change of the value in the up/down counter 60 is not loaded into the feedback register. The DAC will no longer respond to the high and low threshold pulses generated by the comparators 40 and 42. Thus, the DAC generates a constant feedback current matched to cancel the offset current. The circuit is now calibrated and ready for DCFM operation. The frequency modulated signals may be reintroduced to the audio path input to modulate the synthesized signal. Since the DAC no longer responds to changes in the FM signal, the fixed DAC feedback continues to cancel the offset current. Also, the synthesized signal remains at the correct center frequency. However, if the offset current does change, the synthesized signal will drift. In that case, another calibration can be done to return the synthesized signal to center.

A final step to the calibration is to store the value from the feedback register 70 in the memory device 72 to prevent unnecessary recalibration. Intermittent DCFM operation of the circuit is thereby possible without repeating calibration. When subsequently beginning DCFM operation of the circuit, the feedback register 70 can be pre-loaded with the value from the memory device 72. DCFM operation proceeds by holding the DAC feedback constant and applying the FM signal at the FM input 24. Recalibration is thereafter required only when the offset current has changed.

A second embodiment 90 of the frequency modulated PLL circuit 8 is shown in FIG. 3. The circuit 90 is similar in most respects to the circuit 8. For instance, the circuit 90 includes a PLL 92 having a VCO 94, a phase comparator 96, and loop filter 98. A synthesized signal is produced at the output 104. A FM input 106 receives a FM signal to frequency modulate the synthesized signal. The FM signal is AC coupled to the PLL 92 by connecting the FM input 106 to a summing node 108 between the loop filter 98 and VCO 94.

DC coupling of the FM signal is performed in the circuit 90 by integrating the FM signal with an integrator 110. However, instead of connecting the integrator output to a phase modulator as is done in the circuit 8 of FIG. 1, the integrator 110 output is connected to a second summing node 112 connected between the phase comparator 96 and the loop filter 98. Both implementations accomplish DC coupling of the FM signal by introducing phase modulation into the PLL 92.

The circuit 90 also includes circuitry to add and remove a cycle of the VCO output signal in response to high and low threshold pulse signals generated by comparators 116, 118 and control logic 120. Unlike the PLL circuit 8 in FIG. 1 which uses a programmable divider 14 to add and remove cycles, the circuit 90 in FIG. 3 uses separate pulse remove 124 and pulse add 126 blocks connected between the VCO and a divide-by-N counter 128. The pulse remove block 124 produces an output signal having the same frequency as its input. However, in response to a low threshold pulse from the control logic 120, one cycle of the pulse remove block's input is omitted from its output signal. The pulse add block 126 also produces an output signal which mirrors the frequency of its input signal. However, in response to a high threshold pulse from the control logic, one more cycle is inserted into the pulse add block's output signal than is present at its input. The divide-by-N counter 128 then divides the frequency of the signal in the PLL 92 loop by N for comparison with a reference frequency in the phase comparator.

Resetting of the integrator 110 in the circuit 90 is accomplished by current sources 132 and 134. In response to a low threshold pulse signal from the control logic 120, a switch 136 connects the output of current source 132 to the integrator 110 input, injecting a set amount of current into the integrator. The additional amount of current injected into the integrator acts to raise the output of the integrator a set amount above the low threshold voltage level. Similarly, a high threshold pulse signal from the control logic 120 will close switch 138 to connect the current source 134 to the integrator input, and consequently reset the integrator output a set amount below the high threshold level.

The circuit 90 also includes a DAC feedback loop from integrator output to integrator input. An up/down counter 144 is incremented in response to high threshold pulse signals and decremented in response to low threshold pulse signals from the control logic 120. A DAC 146 generates a voltage signal proportional to the count value held in the up/down counter 144. The DAC voltage signal is fed through a resistor network 148 to the integrator input.

Unlike the circuit 8 in FIG. 1, however, there is no feedback register in the circuit 90. The up/down counter 144 responds to the high and low threshold pulse signals as long as an enable signal is applied at an enable input 152. When no enable signal is present at the input 152, the up/down counter maintains its present value. A memory device 154 is connected to the up/down counter 144. The memory device is adapted to store a value from the up/down counter 144 and to pre-load the up/down counter with a stored value.

The circuit 90 performs a DCFM calibration in a manner similar to that described above in connection with the circuit 8 of FIG. 1. First, frequency modulation signals are removed from the FM input 106, leaving DC offsets. Second, an enable signal is applied to input 152 of the up/down counter 144 so that the counter responds to high and low threshold pulse signals. The DAC feedback signal will settle to a level at which the DC offsets are cancelled at the integrator input as was described above with respect to FIG. 2. However, without a feedback register, the up/down counter value is fed directly to the DAC. Third, when the DAC voltage signal has settled, the enable signal is removed from the input 152. Without the enable signal, the value in the up/down counter is fixed. The DAC feedback signal will also be fixed. Fourth, the memory device 154 stores the value in the up/down counter 144. The circuit will then be calibrated for DCFM operation. Unless the DC offsets change, subsequent calibration can be avoided by simply pre-loading the up/down counter with the stored value in the memory device 154 before DCFM operation.

Having described and illustrated the principles of our invention with reference to two illustrative embodiments, it will be recognized that the invention can be modified in arrangement and detail without departing from such principles. Accordingly, we claim as our invention all such embodiments as may come within the scope and spirit of the following claims and equivalents thereto.

We claim:

1. An electronic circuit for calibrating a frequency modulated phase-locked loop (PLL) to cancel an offset current causing center frequency drift of a DCFM synthesized signal comprising:

a PLL for generating said synthesized signal;
    an integrator connected to the PLL for DC coupling an FM signal to the PLL to thereby phase modulate the synthesized signal;
    means for generating a feedback current around the integrator and applying the feedback current to the input of the integrator;
    control means for settling the feedback current to a current magnitude equal and opposite to the magnitude of the offset current when frequency modulation is removed from the FM signal; and
    means for holding the feedback current at said current magnitude when frequency modulation is again added to the FM signal to thereby cancel the offset current during DC coupled frequency modulation of the synthesized signal.

2. The electronic circuit of claim 1 further comprising means for storing a value proportional to said current magnitude and for presetting the means for generating a feedback current to said current magnitude in preparation for resuming DC coupled frequency modulation of the synthesized signal.

3. The electronic circuit of claim 1 wherein the means for generating comprises:

an up/down counter responsive to a first pulse signal from the control means for incrementing a count value in the up/down counter and to a second pulse signal from the control means for decrementing the count value to thereby settle the feedback current to said current magnitude;
    a digital-to-analog converter connected to receive the count value from the up/down counter and operative to generate a voltage signal proportional to the count value; and
    a resister network connected between the digital-to-analog converter and the integrating means for forming said feedback current from the voltage signal.

4. The electronic circuit of claim 3 wherein the means for holding includes an enable signal applied to the up/down counter having a first state at which the up/down counter is responsive to the first and second pulse signals to settle the feedback current to said current magnitude, and a second state at which the up/down counter holds a fixed value to thereby hold the feedback current at said current magnitude.

5. The electronic circuit of claim 4 comprising means for storing a value proportional to said current magnitude and for presetting the up/down counter to said value in preparation for resuming DC coupled frequency modulation of the synthesized signal.

6. The electronic circuit of claim 3 wherein the means for holding includes a feedback register responsive to an enable signal having a first state at which the feedback register passes said count value from the up/down counter to the digital-to-analog converter, and a second state at which the feedback register holds a fixed value to thereby hold the feedback current at said current magnitude.

7. The electronic circuit of claim 6 comprising means for storing a value proportional to said current magnitude and for presetting the feedback register to said value in preparation for resuming DC coupled frequency modulation of the synthesized signal.

8. A method of DC coupling an FM signal to a phase-locked loop with an analog integrator for frequency modulation of a synthesized signal generated by the phase-locked loop without center frequency offset of the synthesized signal caused by an offset signal, comprising:

removing any frequency modulation from the FM signal;
    generating a feedback signal applied to an input of the analog integrator;
    causing the feedback signal to settle to a magnitude equal and opposite to the magnitude of the offset signal whereby the offset signal is cancelled at the input of the analog integrator;

storing a value in a memory device proportional to said magnitude of the feedback signal; and thereafter presetting the feedback signal to said magnitude and holding the feedback signal at said magnitude when frequency modulation is again added to the FM signal to thereby cancel the offset signal during DC coupled frequency modulation of the synthesized signal.

9. The method of claim 8 wherein the step of causing the feedback signal to settle comprises continually repeating the steps of:

increasing the feedback signal whenever the output of the analog integrator is less than a first value; and decreasing the feedback signal whenever the output of the analog integrator exceeds a second value until the feedback signal settles to a magnitude equal and opposite to the magnitude of the offset signal.

10. The method of claim 8 wherein the steps of generating a feedback signal and causing the feedback signal to settle comprise:

maintaining a counter value in a digital counter;

generating a feedback signal continuously proportional to the counter value; and continually repeating the steps of:

incrementing the counter value whenever the output of the analog integrator is less than a first value whereby the feedback signal is incrementally increased; and decrementing the counter value whenever the output of the analog integrator exceeds a second value whereby the feedback signal is incrementally decreased, until the magnitude of the feedback signal settles to a magnitude equal and opposite the magnitude of the offset signal.

11. The method of claim 10 wherein the step of generating a feedback signal continuously proportional to the counter value comprises the steps of continuously:

converting with a digital-to-analog converter the counter value in the digital counter to a voltage signal; and applying the voltage signal to a resistor network to produce a feedback current at the integrator input proportional to the voltage signal.

12. The method of claim 10 wherein the steps of presetting the feedback signal and holding the feedback signal to said magnitude comprise the steps of:

loading the digital counter with the value in the memory device; and operating the digital counter to remain unresponsive to the output of the analog integrator whereby the counter value is maintained unchanged while frequency modulation is again added to the FM signal.

13. The method of claim 10 wherein the step of generating a feedback signal continuously proportional to the counter value comprises the steps of continuously:

loading a feedback register with the counter value;

converting with a digital-to-analog converter the counter value in the feedback register to a voltage signal; and applying the voltage signal to a resistor network to produce a feedback current at the integrator input proportional to the voltage signal.

14. The method of claim 13 wherein the steps of presetting the feedback signal and holding the feedback signal to said magnitude comprise the steps of:

loading the feedback register with the value in the memory device; and maintaining unchanged in the feedback register the value from the memory means while frequency modulation is again added to the FM signal and during DC coupled frequency modulation of the synthesized signal.

15. A method of calibrating to cancel offsets causing center frequency drift of a synthesized signal in an electronic circuit, the method comprising:

generating the synthesized signal with a phase-locked loop;

DC coupling a frequency modulated signal through an integrator to the phase-locked loop;

incrementing a count value when an output of the integrator is less than a first level and decrementing the count value when the output of the integrator exceeds than a second level;

generating a feedback signal proportional to the count value;

applying the feedback signal to the input of the integrator;

removing any modulation components in the frequency modulated signal such that only the offsets remain;

allowing the count value to settle to an equilibrium value such that the feedback signal is equal and opposite to the offsets; and holding the feedback signal constantly equal and opposite to the offsets to thereby cancel the offsets while modulation is restored to the frequency modulated signal for DC coupled frequency modulation operation of the electronic circuit.

16. The method of claim 15 comprising:

storing the equilibrium value in a memory device; and thereafter, setting the feedback signal to be proportional to the equilibrium value prior to operation of the electronic circuit with DC coupled frequency modulation whenever DC coupled frequency modulation of the electronic circuit has been interrupted; and holding the feedback signal constant to cancel the offsets during DC coupled frequency modulation of the electronic circuit.

* * * * *